United States Patent
Kusano et al.

(10) Patent No.: US 7,185,429 B2
(45) Date of Patent: Mar. 6, 2007

(54) MANUFACTURE METHOD OF A FLEXIBLE MULTILAYER WIRING BOARD

(75) Inventors: Hidetoshi Kusano, Kanagawa (JP); Shinji Kumon, Shinjuku-ku (JP)

(73) Assignees: Sony Corporation, Tokyo (JP); Dai Nippon Insatsu Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/350,032

(22) Filed: Feb. 9, 2006

(65) Prior Publication Data

US 2006/0124351 A1 Jun. 15, 2006

Related U.S. Application Data

(62) Division of application No. 10/341,466, filed on Jan. 14, 2003, now Pat. No. 7,115,818.

(30) Foreign Application Priority Data

Jan. 15, 2002 (JP) ............................. 2002-005675

(51) Int. Cl.
*H01K 3/10* (2006.01)
*H05K 1/00* (2006.01)

(52) U.S. Cl. ............................ 29/852; 29/830; 29/847; 174/254; 216/18; 361/794

(58) Field of Classification Search .................. 29/825, 29/830, 831, 846, 847, 852; 156/150; 174/254, 174/260, 262, 267; 216/17, 18, 51, 57; 257/737, 257/738, 778; 361/749, 750, 760, 794, 795; 438/111, 123

See application file for complete search history.

(56) References Cited

U.S. PATENT DOCUMENTS

| 5,227,013 | A | * | 7/1993 | Kumar | .......................... 216/18 |
| 5,756,377 | A | * | 5/1998 | Ohsawa | ...................... 438/111 |
| 5,843,810 | A | * | 12/1998 | Sato et al. | .................. 438/123 |
| 6,310,304 | B1 | | 10/2001 | Hayama et al. | |

(Continued)

FOREIGN PATENT DOCUMENTS

JP 9-246445 9/1997

(Continued)

*Primary Examiner*—Minh Trinh
*Assistant Examiner*—Donghai D. Nguyen
(74) *Attorney, Agent, or Firm*—Oblon, Spivak, McClelland, Maier & Neustadt, P.C.

(57) ABSTRACT

A flexible multilayer wiring board manufactured by laminating a metal foil via an insulating layer to cover the first layer circuit wiring formed on a conductive substrate, and a resist layer is formed to cover the second layer circuit wiring formed by pattern-etching the metal foil. Using the conductive substrate as a power feeding layer, a conductive material is filled, by electrolytic plating, into interlayer via holes each formed applying a laser beam to the resist layer to establish interlayer connection between the first and second layer circuit wirings. Using the conductive substrate as a power feeding layer, a conductive material is filled, by electrolytic plating, into hole portions of an insulating layer formed to cover the second layer circuit wiring to form external connection terminals. Then, the conductive substrate is removed entirely or partly to expose the first layer circuit wiring.

11 Claims, 4 Drawing Sheets

U.S. PATENT DOCUMENTS

| | | |
|---|---|---|
| 6,329,610 B1 | 12/2001 | Takubo et al. |
| 6,351,031 B1 | 2/2002 | Iijima et al. |
| 6,399,891 B1 | 6/2002 | Kurita et al. |
| 6,418,615 B1 * | 7/2002 | Rokugawa et al. ............ 29/852 |
| 6,441,314 B2 | 8/2002 | Rokugawa et al. |
| 6,591,491 B2 * | 7/2003 | Fujii et al. .................... 29/830 |
| 6,759,739 B2 * | 7/2004 | Nakamura et al. .......... 257/700 |
| 6,912,779 B2 * | 7/2005 | Naitoh et al. ................. 29/852 |

FOREIGN PATENT DOCUMENTS

| | | |
|---|---|---|
| JP | 2001308533 A | 11/2001 |

* cited by examiner

MANUFACTURE METHOD OF A FLEXIBLE MULTILAYER WIRING BOARD

CROSS REFERENCE TO RELATED APPLICATIONS

This application is a divisional of application Ser. No. 10/341,466 filed on Jan. 14, 2003, now U.S. Pat. No. 7,115,818.

BACKGROUND OF THE INVENTION

The present invention relates to a multilayer wiring board for mounting a semiconductor chip thereon and, in particular, to a flexible multilayer wiring board with high density wiring (buildup flexible multilayer wiring board), and further relates to a manufacture method for easily manufacturing such a board.

In recent years, higher integration and higher performance have been increasingly required for semiconductor devices, and the increase in numbers of terminals thereof has also been remarkable. For example, in case of surface mount packages such as a QFP (Quad Flat Package), the increased numbers of terminals have been achieved by narrowing the pitches of external terminals without enlarging the package sizes. However, following the narrowing of the external terminal pitches, the width of each external terminal itself is reduced to lower a strength thereof. As a result, it becomes difficult to cope with the skew of the external terminals and maintain the flatness thereof in a later process such as forming. Thus, there has been a problem of difficulty in ensuring the mounting accuracy of semiconductor packages.

For coping therewith, those packages represented by a BGA (Ball Grid Array) have been developed, wherein a multilayer wiring board is used as an interposer. The BGA is normally mounted with a semiconductor chip on one side of the board and provided with spherical solder balls on the other side thereof as external connection terminals, thereby to ensure electrical connection between terminals of the semiconductor chip and the external connection terminals (solder balls), and thus is a package that aims improvement in mountability.

On the other hand, the bare chip mounting method has been recently proposed wherein a chip not packaged (bare chip) is directly mounted onto a multilayer wiring board. In the bare chip mounting method, a semiconductor device•chip is mounted onto a connection pad portion of wiring formed on a multilayer wiring board in advance. Inasmuch as the chip is not sealed in a package as noted above, conducting paths between the wiring of the multilayer wiring board and the chip can be simplified and shortened. Further, since the mounting density is improved, distances to other chips can also be shortened. Therefore, not only reduction in size and weight, but also high-speed signal processing can be expected.

In general, multilayer wiring boards used in such a bare chip mounting method are manufactured by using, as a core board, a double-sided board having low density wiring formed by the subtractive method or the like, and forming high density wiring on each side of the core board by the buildup method.

However, the formation of the high density wiring using the buildup method requires complicated processes, and it has been difficult to produce the high density wiring with a line/space width being 25 µm/25 µm or less. Specifically, the conventional buildup method requires complicated processes, such as a process of forming a power feeding layer on the roughened surface of a resin layer by electroless plating, a process of forming a wiring pattern by providing a plating resist on the power feeding layer and performing electrolytic plating, and a process of flash etching (electroless plating layer removing process) that is carried out thereafter. Further, in the formation of the fine wiring with a line/space width being 25 µm/25 µm or less, there has been a problem that a short circuit is liable to occur due to the residue of the electroless plating layer caused upon removal thereof by the flash etching, leading to difficulty in ensuring reliability.

There has been disclosed a manufacture method, wherein circuit wiring is formed on a copper substrate by electrolytic plating, an insulating layer is formed so as to cover the circuit wiring, hole portions for formation of external terminals are provided in the insulating layer, then, after forming the terminals in the hole portions by electrolytic plating using the copper substrate as a power feeding layer, the copper substrate is selectively etched thereby to provide a lead frame (JP-A-H9-246445). According to this manufacture method, as opposed to the foregoing buildup method, inasmuch as the electroless plating process and the electroless plating layer removing process using the flash etching are unnecessary, the high density wiring with a line/space width being 25 µm/25 µm or less is made possible. However, since the lead frame obtained by this manufacture method has a single-layer structure, an obtained multi-pin LSI requires a large package size and thus it has been difficult to use it in an electronic device that highly requires reduction in size and weight. Further, it is impossible to manufacture a multilayer wiring board according to the foregoing manufacture method (JP-A-H9-246445).

On the other hand, the foregoing conventional multilayer wiring board has a limit in reducing the size and weight because of use of the core board. For example, there has been a problem of being unable to satisfy the demand for reduction in size and weight in small communication devices and so forth. In view of this, a flexible multilayer wiring board is considered wherein circuit wirings are formed in multilayers via insulating layers made of polyimide or the like without using the core board. However, in stacking the circuit wirings using the conventional buildup method, there has been a problem, in addition to the foregoing problem relating to the electroless plating process and the flash etching process, that a power feeding layer having an excellent adhesion relative to polyimide can not be formed by electroless plating. As described above, such a flexible multilayer wiring board that can be used practically, particularly such a flexible multilayer wiring board that is provided with high density wiring, has not yet been achieved, and thus the flexible multilayer wiring board that can be put to practical use has been desired for the purpose of realizing further reduction in size and weight in the small communication devices and so forth.

SUMMARY OF THE INVENTION

The present invention has been made in view of the foregoing circumstances and has an object of providing a flexible multilayer wiring board with high density wiring and high reliability (buildup flexible multilayer wiring board), and a manufacture method based on a new buildup method that can easily manufacture such a flexible multilayer wiring board.

For accomplishing the foregoing object, a flexible multilayer wiring board of the present invention is configured that first to N-th (N is an integer equal to or greater than 2) layer circuit wirings are stacked in layers via an insulating layer therebetween, the first layer circuit wiring is located on the outermost surface, and the circuit wirings of the respective layers are interlayer-connected by via portions, that the N-th layer circuit wiring is covered with an insulating layer on its side remote from the (N−1)th layer circuit wiring, and the N-th layer circuit wiring is connected to external connection terminals formed so as to penetrate the insulating layer and project from the surface of the insulating layer, and that a line/space width in a highest density portion of each of the circuit wirings falls within the range of 5 µm/5 µm to 25 µm/25 µm.

A manufacture method of a flexible multilayer wiring board according to the present invention is configured to comprise a first step of forming a resist pattern on a conductive substrate, and depositing a conductive material on the conductive substrate through electrolytic plating using the resist pattern as a mask, thereby to form a first layer circuit wiring, a second step of laminating metal foil over the conductive substrate via an insulating layer therebetween so as to cover the first layer circuit wiring, and pattern-etching the metal foil to form a second layer circuit wiring, a third step of forming a resist layer over the conductive substrate so as to cover the second layer circuit wiring, and applying a laser beam to the resist layer at its portions corresponding to predetermined positions where the first layer circuit wiring and the second layer circuit wiring are overlapped with each other via the insulating layer therebetween, thereby to form interlayer via holes so as to expose the first layer circuit wiring, a fourth step of forming via portions by filling a conductive material in the interlayer via holes through electrolytic plating using the conductive substrate as a power feeding layer, thereby to establish interlayer connection between the first layer circuit wiring and the second layer circuit wiring, a fifth step of removing the resist layer, forming an insulating layer over the conductive substrate so as to cover the second layer circuit wiring, forming insulating layer hole portions at predetermined portions of the insulating layer so as to expose the second layer circuit wiring, and filling a conductive material in the insulating layer hole portions by electrolytic plating using the conductive substrate as a power feeding layer, thereby to form external connection terminals, and a sixth step of exposing the first layer circuit wiring by entirely removing the conductive substrate or removing the conductive substrate such that part of the conductive substrate remains.

According to the present invention, inasmuch as the flexible multilayer wiring board does not use a core board as opposed to the conventional multilayer wiring board, even if the number of layers of the circuit wirings is the same, the thickness can be largely reduced, and further, the line/space width in the highest density portion of each of the circuit wirings falls within the range of 5 µm/5 µm to 25 µm/25 µm. This makes possible further reduction in size and weight in small communication devices and so forth.

Further, in the manufacture method of the flexible multilayer wiring board according to the present invention, the metal foil is laminated via the insulating layer and, by pattern-etching this metal foil, the circuit wiring of an upper layer is formed. Therefore, even on the insulating layer made of polyimide or the like that is reluctant to ensure adhesion with an electroless plating layer, the circuit wiring can be formed so that a multilayer structure of the flexible wiring board is made possible. Further, since the interlayer connection is achieved through the via portions formed by filling the conductive material into the via holes through electrolytic plating, a so-called stacked via structure is made possible to accomplish densification of the wiring. Moreover, since the electroless plating process and the flash etching process for removing the electroless plating layer are unnecessary, the reduction in cost is made possible. Simultaneously, in the present invention, since a short circuit or the like in a fine wiring portion caused by the residue of the electroless plating layer does not occur, the high density wiring with a line/space width being, for example, 25 µm/25 µm or less can be formed. This makes it possible to manufacture a flexible multilayer wiring board with high density wiring and high reliability (buildup flexible multilayer wiring board).

DESCRIPTION OF THE PREFERRED EMBODIMENT

Hereinbelow, preferred embodiments of the present invention will be described with reference to the drawings.

Flexible Multilayer Wiring Board

Figure 1:
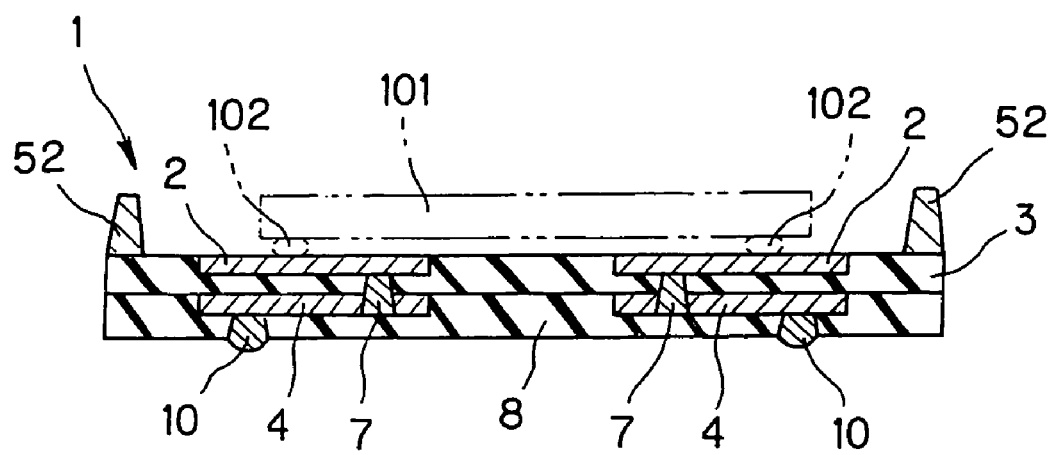
FIG. 1 is a schematic sectional view showing one preferred embodiment of a flexible multilayer wiring board according to the present invention.

FIG. 1 is a schematic sectional view showing one preferred embodiment of a flexible multilayer wiring board according to the present invention. In FIG. 1, a flexible multilayer wiring board 1 of the present invention has a two-layer structure wherein a first layer circuit wiring 2 is provided on the outermost surface, and a second layer circuit wiring 4 is provided via an insulating layer 3 relative to the first layer circuit wiring 2. Interlayer connection is established between the first layer circuit wiring 2 and the second layer wiring circuit 4 by via portions 7. Further, the second layer circuit wiring 4 is covered with an insulating layer 8, and external connection terminals 10 each formed so as to project from the surface of the insulating layer 8 are connected to the second layer circuit wiring 4. Each of the first layer circuit wiring 2 and the second layer circuit wiring 4 of the thus structured flexible multilayer wiring board 1 is in the form of the high density wiring wherein a line/space width in its highest density portion falls within the range of 5 µm/5 µm to 25 µm/25 µm.

Figure 2:
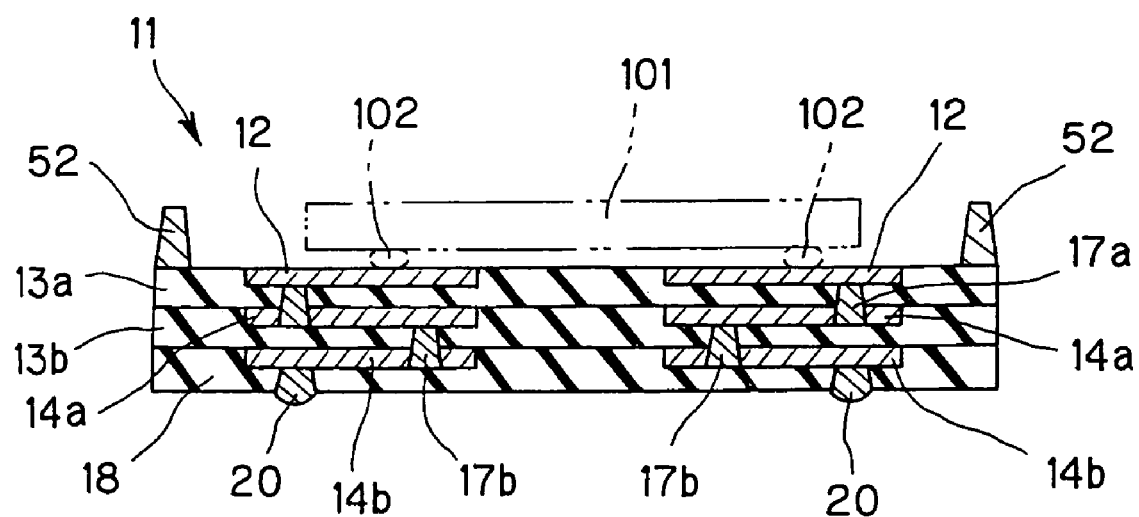
FIG. 2 is a schematic sectional view showing another preferred embodiment of a flexible multilayer wiring board according to the present invention.

FIG. 2 is a schematic sectional view showing another preferred embodiment of a flexible multilayer wiring board according to the present invention. In FIG. 2, a flexible multilayer wiring board 11 of the present invention has a three-layer structure wherein a first layer circuit wiring 12 is provided on the outermost surface, a second layer circuit wiring 14a is provided via an insulating layer 13a relative to the first layer circuit wiring 12, and a third layer circuit wiring 14b is provided via an insulating layer 13b. In this flexible multilayer wiring board 11, interlayer connection is established between the first layer circuit wiring 12 and the second layer wiring circuit 14a by via portions 17a, and interlayer connection is established between the second layer circuit wiring 14a and the third layer wiring circuit 14b by via portions 17b. Further, the third layer circuit wiring 14b is covered with an insulating layer 18, and external connection terminals 20 each formed so as to project from the surface of the insulating layer 18 are connected to the third layer circuit wiring 14b. Each of the first layer circuit wiring 12, the second layer circuit wiring 14a and the third layer circuit wiring 14b of the thus structured flexible multilayer wiring board 11 is in the form of the high density wiring wherein a line/space width in its highest density portion falls within the range of 5 μm/5 μm to 25 μm/25 μm.

Figure 3:
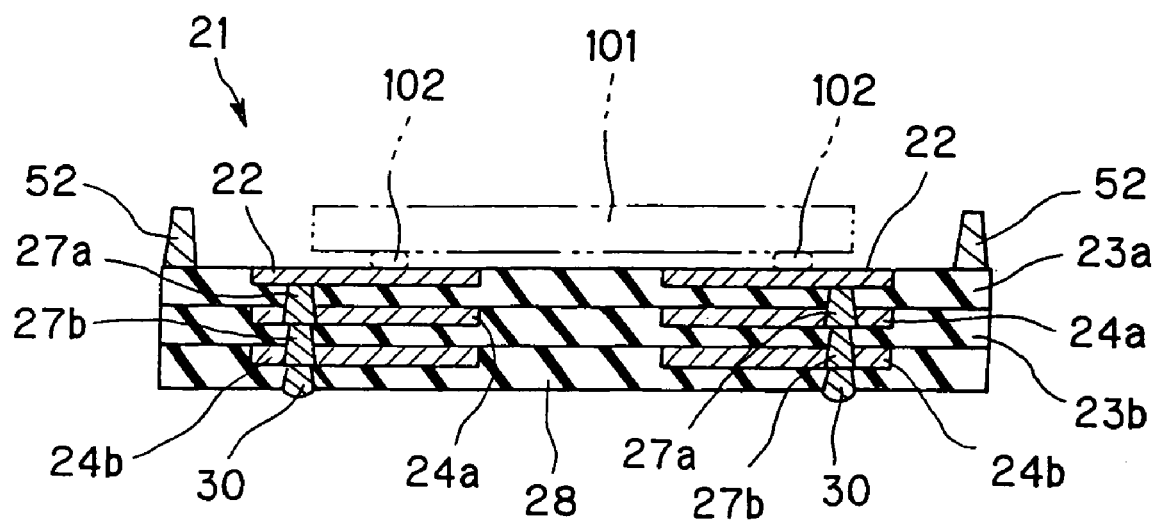
FIG. 3 is a schematic sectional view showing another preferred embodiment of a flexible multilayer wiring board according to the present invention.

FIG. 3 is a schematic sectional view showing another preferred embodiment of a flexible multilayer wiring board according to the present invention. In FIG. 3, a flexible multilayer wiring board 21 of the present invention has a three-layer structure wherein a first layer circuit wiring 22 is provided on the outermost surface, a second layer circuit wiring 24a is provided via an insulating layer 23a relative to the first layer circuit wiring 22, and a third layer circuit wiring 24b is provided via an insulating layer 23b. Accordingly, from this aspect, the flexible multilayer wiring board 21 is the same as the foregoing flexible multilayer wiring board 11. On the other hand, the flexible multilayer wiring board 21 differs from the flexible multilayer wiring board 11 in that the former has a stacked via structure wherein via portions 27a for establishing interlayer connection between the first layer circuit wiring 22 and the second layer wiring circuit 24a, and via portions 27b for establishing interlayer connection between the second layer circuit wiring 24a and the third layer wiring circuit 24b are located in the same positions in a multi-layering direction. By employing such a stacked via structure, formation of higher density circuit wiring is made possible. Also in the flexible multilayer wiring board 21, the third layer circuit wiring 24b is covered with an insulating layer 28, and external connection terminals 30 each formed so as to project from the surface of the insulating layer 28 are connected to the third layer circuit wiring 24b. Each of the first layer circuit wiring 22, the second layer circuit wiring 24a and the third layer circuit wiring 24b of the thus structured flexible multilayer wiring board 21 is in the form of the high density wiring wherein a line/space width in its highest density portion falls within the range of 5 μm/5 μm to 25 μm/25 μm.

In the foregoing flexible multilayer wiring board 1, 11, 21, a semiconductor chip 101 (shown by two-dot chain line in FIGS. 1 to 3) can be mounted onto the first layer circuit wiring 2, 12, 22 located on the outermost surface, via metal bumps such as solder bumps 102. The flexible multilayer wiring board 1, 11, 21 mounted with the semiconductor chip 101 can be mounted onto a printed wiring board (mother board) via the foregoing external connection terminals 10, 20, 30.

As described above, since the flexible multilayer wiring board of the present invention does not use a core board as opposed to the conventional multilayer wiring board, even if the number of layers of the circuit wirings is the same, the thickness can be largely reduced, and further, the line/space width in the highest density portion of each of the circuit wirings falls within the range of 5 μm/5 μm to 25 μm/25 μm. This makes it possible to further reduce the size and weight of electronic devices, particularly small electronic devices.

In each of the foregoing embodiments, an outer frame 52 for the purpose of defining a flow range of sealing resin is provided on the outermost surface. However, it may also be configured to omit this outer frame 52. Further, in each of the foregoing embodiments, the circuit wirings have the two-layer structure or the three-layer structure. However, a multilayer structure with four layers or more may also be adopted.

The first layer circuit wiring 2, 12, 22 constituting the flexible multilayer wiring board of the present invention may have a single-layer structure made of a conductive material selected from copper, nickel, gold and so forth, or may have a multilayer structure having a gold layer on the surface (semiconductor chip mounting surface). In case of the multilayer structure, it may be, for example, a three-layer structure wherein a gold layer, a nickel layer and a copper layer are stacked from the side of the surface. The thickness of the first layer circuit wiring 2, 12, 22 thus structured can be set within the range of 5 μm to 30 μm.

Further, each of the second layer circuit wiring 4, 14a, 24a and the third layer circuit wiring 14b, 24b constituting the flexible multilayer wiring board of the present invention may have a single-layer structure made of a conductive material selected from copper, nickel, gold and so forth, and the thickness thereof can be set within the range of 3 μm to 18 μm.

Further, the insulating layer 3, 8, 13a, 13b, 18, 23a, 23b, 28 constituting the flexible multilayer wiring board of the present invention preferably has an excellent electrical insulating property and suitable flexibility and strength, and may be made of an insulating material such as polyimide, aramid resin, epoxy resin and acrylic resin. It is sufficient that the insulating layer can fully cover the circuit wiring of the corresponding layer. The thickness thereof can be set within the range of, for example, 12 μm to 50 μm.

A material of the via portions 7, 17a, 17b, 27a, 27b constituting the flexible multilayer wiring board of the present invention may be one of copper, nickel, silver and so forth. On the other hand, a material of the external connection terminals 10, 20, 30 may be one of solder alloy, Ni—Au, Cu—Ni—Au and so forth.

Further, the outer frame 52 provided on the outermost surface in each of the foregoing embodiments has no limit in its material and may be made of, for example, copper, stainless steel or nickel alloy.

Manufacture Method of Flexible Multilayer Wiring Board

Now, the manufacture method of the flexible multilayer wiring board of the present invention will be described.

FIGS. 4A to 4D and 5A to 5D are process diagrams showing one preferred embodiment of the manufacture method of the present invention, wherein the foregoing flexible multilayer wiring board 1 is used as an example.

[First Process]

Figure 4A:
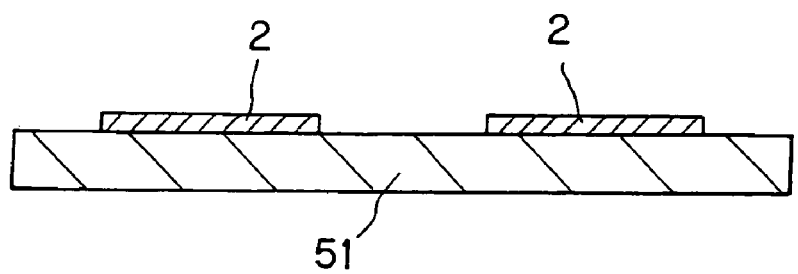
FIGS. 4A to 4D are process diagrams showing one preferred embodiment of a manufacture method of the flexible multilayer wiring board according to the present invention.

According to the present invention, in the first process, a resist pattern of a predetermined shape is first formed on a conductive substrate 51. Then, by depositing a conductive material on the conductive substrate 51 through electrolytic plating using the resist pattern as a mask, the first layer circuit wiring 2 is formed (FIG. 4A).

As the conductive substrate 51 to be used, there can be cited a copper substrate, a stainless steel substrate, a nickel alloy substrate or the like. The thickness of the conductive substrate 51 can be set taking into account a later-described removing process of the conductive substrate 51, the handleability in each process and so forth, and may be set to a value within the range of, for example, 0.1 mm to 0.3 mm.

The foregoing resist pattern can be formed by carrying out film formation using a dry film resist or a liquid resist, and performing predetermined pattern exposure and development.

Taking into account the material of the conductive substrate 51, the later-described removing process of the conductive substrate 51 and so forth, the first layer circuit wiring 2 to be formed may have, for example, a single-layer structure made of copper, gold, nickel or the like, a four-layer structure wherein a nickel layer, a gold layer, a nickel layer and a copper layer are stacked from the side of the conductive substrate 51, or a three-layer structure wherein a gold layer, a nickel layer and a copper layer are stacked from the side of the conductive substrate 51. The thickness of the first layer circuit wiring 2 can be set within the range of 5 μm to 30 μm. The first layer circuit wiring 2 thus structured can be in the form of fine wiring with a line/space width being 25 μm/25 μm or less.

[Second Process]

Figure 4B:
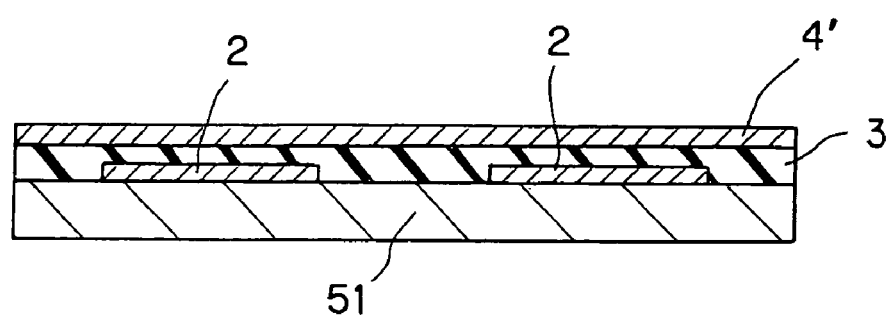
Figure 4C:
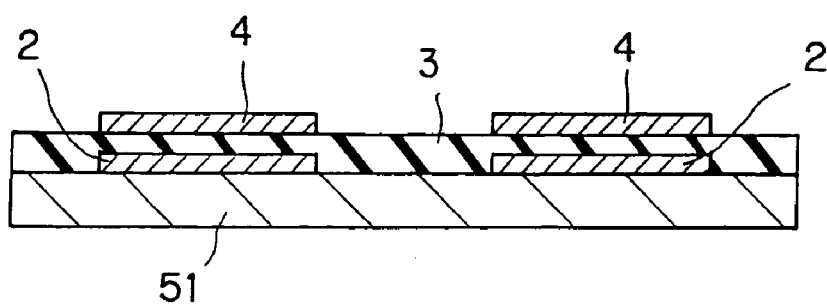

Next, in the second process, metal foil 4' is laminated onto the conductive substrate 51 via the insulating layer 3 therebetween so as to cover the first layer circuit wiring 2 formed in the foregoing manner (FIG. 4B). Then, a resist pattern of a predetermined shape is formed on the metal foil 4' and, by pattern-etching the metal foil 4' using the resist pattern as a mask, the second layer circuit wiring 4 is formed (FIG. 4C).

The foregoing insulating layer 3 preferably has an excellent electrical insulating property and suitable flexibility and strength, and may be made of a material such as polyimide insulating resin or acrylic insulating resin. The thickness of the insulating layer 3 is set to a value that can fully cover the first layer circuit wiring 2, and thus can be set within the range of, for example, 25 μm to 50 μm. On the other hand, as the metal foil 4', electrolytic copper foil or rolled copper foil, for example, may be used, and the thickness thereof can be set within the range of 3 μm to 18 μm.

Lamination of the metal foil 4' onto the conductive substrate 51 via the insulating layer 3 can be implemented using a method wherein the conductive substrate 51, the insulating layer 3 and the metal foil 4' are bonded together using vacuum lamination or hot pressing. Alternatively, metal foil 4' that is provided with an insulating resin layer on one side thereof beforehand may be used and, by laminating the metal foil 4' onto the conductive substrate 51 such that the insulating resin layer covers the first layer circuit wiring 2, the insulating layer 3 and the metal foil 4' may be laminated on the conductive substrate 51.

The pattern etching of the metal foil 4' is implemented such that the resist pattern is formed on the metal foil 4' by carrying out film formation using a dry film resist or a liquid resist, and performing predetermined pattern exposure and development, then the metal foil 4' is etched by an etching liquid using the resist pattern as a mask. The etching liquid to be used can be suitably selected correspondingly to a material of the metal foil 4', and an iron chloride solution, a copper chloride solution or a copper selective etching liquid, for example, may be used. There is no particular limit in etching condition, but in case of spray etching, for example, the etching liquid temperature may be set to approximately 30° C. to 75° C., and the spray pressure to approximately 0.05 MPa to 0.5 MPa.

In the formation of the second layer circuit wiring 4 as described above, the electroless plating process and the flash etching process for removing the electroless plating layer after the formation of the circuit wiring required in the conventional buildup method are unnecessary and thus a short circuit or the like in a fine wiring portion caused by the residue of the electroless plating layer does not occur. Accordingly, the high density wiring with a line/space width being, for example, 25 μm/25 μm or less can be formed.

[Third Process]

Figure 4D:
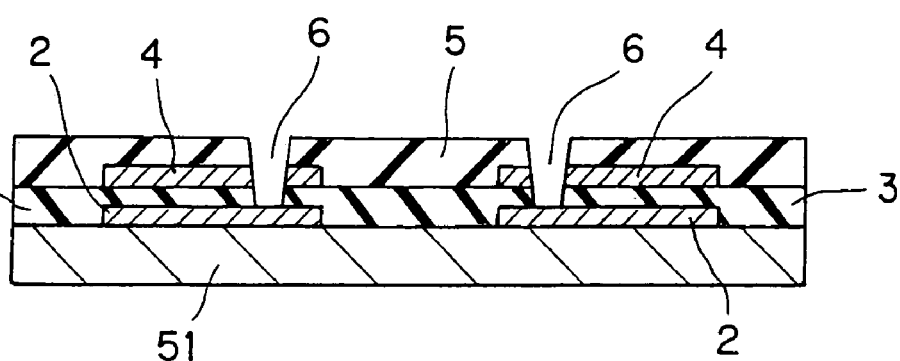

Subsequently, in the third process, a resist layer 5 is formed over the conductive substrate 51 so as to cover the second layer circuit wiring 4, then a laser beam is applied to the resist layer 5 at each of its portions corresponding to positions where the first layer circuit wiring 2 and the second layer circuit wiring 4 are overlapped with each other via the insulating layer 3 therebetween, thereby to form interlayer via holes 6 so that the first layer circuit wiring 2 is exposed (FIG. 4D).

Each interlayer via hole 6 normally has a diameter of about 40 μm to 120 μm and a depth that goes through the second layer circuit wiring 4 to expose the first layer circuit wiring 2. A laser that is used for forming such an interlayer via hole 6 is of the type that can suitably set a laser kind, a laser wavelength, a laser power and so forth taking into account materials etc. of the resist layer 5 and the second layer circuit wiring 4. For example, a pulse excitation solid state laser such as a UV-YAG laser, or a continuous excitation solid state laser may be used.

[Fourth Process]

Figure 5A:
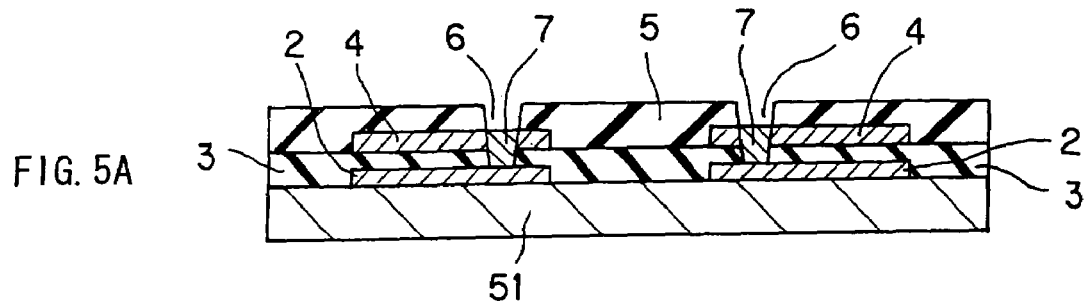
FIGS. 5A to 5D are process diagrams showing the preferred embodiment of the manufacture method of the flexible multilayer wiring board according to the present invention.

Then, using the conductive substrate 51 as a power feeding layer and the resist layer 5 as a mask, a conductive material is filled in the interlayer via holes 6 by electrolytic plating to form the via portions 7 so that interlayer connection between the first layer circuit wiring 2 and the second layer circuit wiring 4 is established (FIG. 5A). As the conductive material for forming the via portions 7, copper or the like can be used.

[Fifth Process]

Figure 5B:
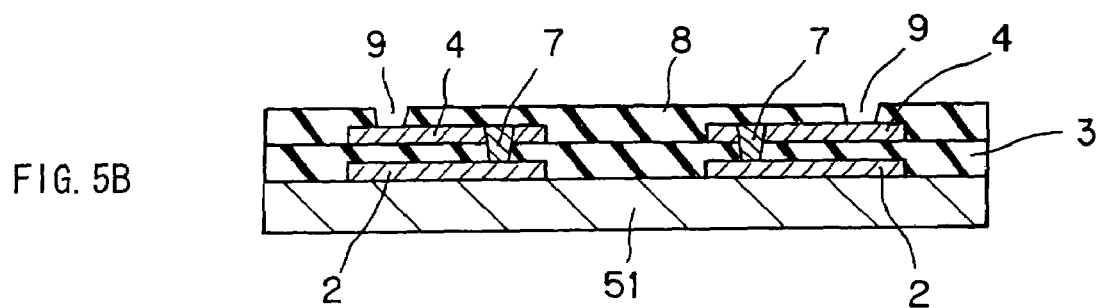
Figure 5C:
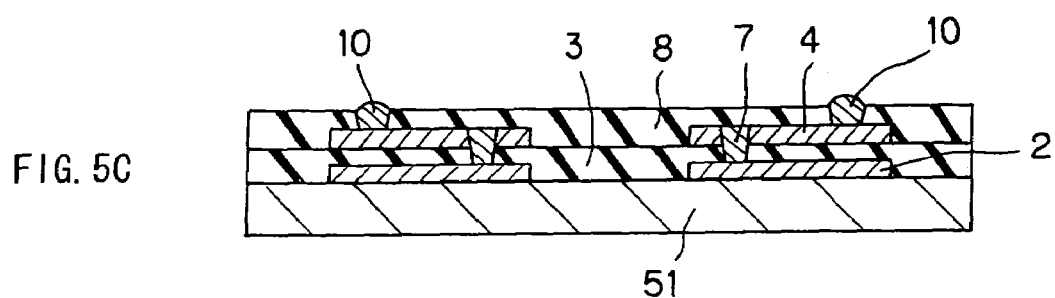

Subsequently, in the fifth process, the resist layer 5 is removed and the insulating layer 8 is formed over the conductive substrate 51 so as to cover the second layer circuit wiring 4, then insulating layer hole portions 9 are formed at predetermined portions of the insulating layer 8 so as to expose the second layer circuit wiring 4 (FIG. 5B). Then, using the conductive substrate 51 as a power feeding layer and the insulating layer 8 as a mask, a conductive material is filled in the insulating layer hole portions 9 by electrolytic plating to form the external connection terminals 10 (FIG. 5C).

The insulating layer 8 may be made of, for example, polyimide insulating resin, acrylic insulating resin or solder resist. The thickness of the insulating layer 8 is set to a value that can fully cover the second layer circuit wiring 4, and thus can be set within the range of, for example, 25 μm to 50 μm. Each insulating layer hole portion 9 formed in the insulating layer 8 normally has a diameter of about 100 μm to 500 μm and can be formed using a laser or a resin etching liquid. On the other hand, each external connection terminal 10 can be formed of solder alloy, nickel, copper, gold or the like by electrolytic plating.

[Sixth Process]

Figure 5D:
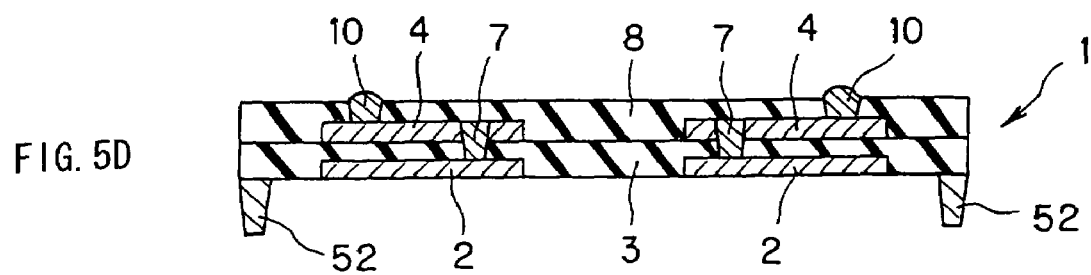

Finally, in the sixth process, the conductive substrate 51 is removed by selective etching with the outer frame 52 remaining, thereby to expose the first layer circuit wiring 2 (FIG. 5D).

The selective etching of the conductive substrate 51 is implemented such that a resist pattern is formed on the conductive substrate 51 by carrying out film formation using a dry film resist or a liquid resist on the conductive substrate 51, and performing predetermined pattern exposure and development, then the conductive substrate 51 is etched by an etching liquid using the resist pattern as a mask. The etching liquid to be used can be suitably selected correspondingly to a material of the conductive substrate 51, and an iron chloride solution, a copper chloride solution or a copper selective etching liquid, for example, may be used. There is no particular limit in etching condition, but in case of spray etching, for example, the etching liquid temperature may be set to approximately 30° C. to 75° C., and the spray pressure to approximately 0.05 MPa to 0.5 MPa. On the other hand, if it is not necessary to form the outer frame 52, the conductive substrate 51 is all removed by etching.

In the removal of the conductive substrate 51 by etching, if an etching liquid to be used also dissolves the first layer circuit wiring 2, it is necessary to control the etching process to be stopped upon exposure of the first layer circuit wiring 2. By forming the first layer circuit wiring 2 to have the four-layer structure composed of the nickel layer, the gold layer, the nickel layer and the copper layer stacked from the side of the conductive substrate 51 as described above, the control of the etching process can be made unnecessary. Specifically, when the conductive substrate 51 is a copper substrate and the copper selective etching liquid is used as an etching liquid, the nickel layer contacting the conductive substrate 51 serves as an etching stopper to prevent dissolution of the first layer circuit wiring 2 by the etching liquid. On the other hand, if the conductive substrate 51 is a stainless steel substrate, by forming the first layer circuit wiring 2 to have the three-layer structure composed of the gold layer, the nickel layer and the copper layer stacked from the side of the conductive substrate 51, the gold layer contacting the conductive substrate 51 functions as an etching stopper to prevent dissolution of the first layer circuit wiring 2 by the etching liquid.

Further, in the present invention, if it is not necessary to form the outer frame 52, the conductive substrate 51 may be removed by physical exfoliation, rather than the foregoing removal of the conductive substrate 51 by etching. In this case, it is necessary that the conductive substrate 51 and the first layer circuit wiring 2 are made of materials having a small adhesion strength therebetween. For example, the conductive substrate 51 may be a stainless steel substrate while the surface layer of the first layer circuit wiring 2 may be made of gold or copper.

Through the foregoing respective processes, the flexible multilayer wiring board 1 of the two-layer structure as shown in FIG. 1 can be obtained.

As described above, in the present invention, the circuit wirings can be formed in multilayers by laminating the metal foil via the insulating layer and pattern-etching this metal foil, so that the electroless plating process and the flash etching process for removing the electroless plating layer become unnecessary.

Further, in case of manufacturing the flexible multilayer wiring board 11, 21 of the three-layer structure as shown in FIG. 2 or 3, the second layer circuit wiring 14a, 24a and the third layer circuit wiring 14b, 24b can be formed and the interlayer connection between the layers can be achieved by repeating the foregoing second to fourth processes twice. Thereafter, by applying the fifth process to the third layer circuit wiring 14b, 24b, the external connection terminals 20, 30 can be formed. Further, by increasing the number of times of repetition of the foregoing second to fourth processes, a flexible multilayer wiring board of a desired multilayer structure with four layers or more can be manufactured.

Now, the present invention will be described in more details showing concrete examples.

EXAMPLE 1

A copper substrate having a thickness of 0.125 mm (EFTEC64T produced by Furukawa Electric Co., Ltd.) was prepared as a conductive substrate and a resist (HTB-120N produced by JSR Corporation) was applied onto the copper substrate, then a predetermined resist pattern was formed. Subsequently, using the copper substrate as a power feeding layer and the resist pattern as a mask, a nickel plating layer (thickness: 2 μm), a gold plating layer (thickness: 1 μm), a nickel plating layer (thickness: 2 μm) and a copper plating layer (thickness: 5 μm) were stacked by electrolytic plating in the order named, thereby to form the first layer circuit wiring of a four-layer structure. Thereafter, the resist pattern was removed. This first-layer circuit wiring had a line/space width of 10 μl/10 μm. (hereinabove, First Process)

Then, an insulating sheet (thickness: 35 μm; Bonding Sheet produced by Nippon Steel Chemical Co., Ltd.) and copper foil (thickness: 3 μm; produced by Mitsui Mining and Smelting Co., Ltd.) were superposed on the copper substrate so as to cover the first layer circuit wiring, then the copper substrate, the insulating sheet and the copper foil were thermo-compressed by hot pressing (180° C., 60 minutes) so that the insulating layer and the copper foil were laminated on the copper substrate.

Then, a resist (HTB-120N produced by JSR Corporation) was applied onto the copper foil, and a predetermined resist pattern was formed. Subsequently, using this resist pattern as a mask, the copper foil was pattern-etched by spray etching (0.10 MPa) using an iron chloride solution (40° C.) to form the second layer circuit wiring. Thereafter, the resist pattern was removed. This second-layer circuit wiring had a line/space width of 15 μm/15 μm. (hereinabove, Second Process)

Subsequently, a resist (NIT-225 produced by Nichigo-Morton Co., Ltd.) was laminated over the copper substrate so as to cover the second layer circuit wiring, thereby to form a resist layer. Thereafter, a UV-YAG laser beam was applied to the resist layer at each of its portions corresponding to predetermined positions where the first layer circuit wiring and the second layer circuit wiring were overlapped with each other via the insulating layer therebetween, thereby to form interlayer via holes (two diameters: 70 μm and 100 μm) so that the first layer circuit wiring was exposed. (hereinabove, Third Process).

Then, using the copper substrate as a power feeding layer and the resist layer as a mask, the interlayer via holes were copper-plated by electrolytic plating using a copper sulfate plating bath (Dk=1), thereby to form via portions so that interlayer connection was established between the first layer circuit wiring and the second layer circuit wiring. (hereinabove, Fourth Process)

Then, the resist layer was removed, and an insulating resin sheet having a thickness of 25 μm (Polyamic Acid Sheet (SFP) produced by Nippon Steel Chemical Co., Ltd.) was laminated over the copper substrate so as to cover the second layer circuit wiring, thereby to form an insulating layer. Subsequently, a resist (SFP Photosensitive Layer produced by Nippon Steel Chemical Co., Ltd.) was applied onto the insulating layer, and a predetermined resist pattern was formed. Then, using this resist pattern as a mask, the insulating layer was pattern-etched using a potassium hydroxide aqueous solution (etching liquid for polyamic acid sheet), thereby to form insulating layer hole portions (three diameters: 130 μm, 150 μm, 250 μm).

Subsequently, using the copper substrate as a power feeding layer and the insulating layer as a mask, conductive materials were filled in the insulating layer hole portions by electrolytic plating in order of a nickel plating layer and a gold plating layer, thereby to form external connection terminals (thickness: 30 μm). (hereinabove, Fifth Process)

Then, film formation was performed on the copper substrate using a resist (α340 produced by Tokyo Ohka Kogyo Co., Ltd.) and a resist pattern (thickness: 40 μm) was formed by carrying out predetermined pattern exposure and development. Subsequently, using this resist pattern as a mask, the copper substrate was etched by performing spray etching (etching liquid temperature: 50° C., spray pressure: 0.2 MPa) using a copper selective etching liquid (A Process produced by Meltex Inc.), and further, nickel was selectively etched using a nickel etching liquid, thereby to expose the gold plating layer forming the first layer circuit wiring and form an outer frame. (hereinabove, Sixth Process)

Through the foregoing processes, there was obtained the flexible multilayer wiring board having the two-layer structure as shown in FIG. 1 and having the line/space widths falling within the range of 5 μm/5 μm to 25 μm/25 μm.

EXAMPLE 2

Through the first process like in Example 1, the first layer circuit wiring having a line/space width of 10 μm/10 μm was formed on a copper substrate.

Then, by repeating twice the second to fourth processes of Example 1, the second layer circuit wiring and the third layer circuit wiring were formed and interlayer connection between the layers was carried out. Each of the second layer circuit wiring and the third layer circuit wiring thus formed had a line/space width of 15 μm/15 μm.

Thereafter, like in the fifth process of Example 1, an insulating layer and external connection terminals were formed on the third layer circuit wiring. Then, like in the sixth process of Example 1, the copper substrate was etched to form an outer frame.

Through the foregoing processes, there was obtained the flexible multilayer wiring board having the three-layer structure as shown in FIG. 2 and having the line/space widths falling within the range of 5 μm/5 μm to 25 μm/25 μm.

What is claimed is:

1. A manufacture method of a flexible multilayer wiring board having a plurality of circuit wirings stacked in layers via an insulating layer therebetween, said circuit wirings of the respective layers being interlayer-connected by via portions, said manufacture method including:
    a first forming of a resist pattern on a conductive substrate, and depositing a conductive material on said conductive substrate through electrolytic plating using said resist pattern as a mask, thereby to form a first layer circuit wiring;
    laminating metal foil over said conductive substrate via an insulating layer therebetween so as to cover said first layer circuit wiring, and pattern-etching said metal foil to form a second layer circuit wiring;
    a second forming of a resist layer over said conductive substrate so as to cover said second layer circuit wiring, and applying a laser beam to said resist layer at portions corresponding to predetermined positions where said first layer circuit wiring and said second layer circuit wiring are overlapped with each other via the insulating layer therebetween, thereby to form interlayer via holes so as to expose said first layer circuit wiring through the resist layer, the second layer circuit wiring and the insulating layer;
    a third forming of via portions by filling a conductive material in said interlayer via holes through electrolytic plating using said conductive substrate as a power feeding layer, thereby to establish interlayer connection between said first layer circuit wiring and said second layer circuit wiring;
    removing said resist layer, forming an insulating layer over said conductive substrate so as to cover said second layer circuit wiring, forming insulating layer hole portions at predetermined portions of said insulating layer so as to expose said second layer circuit wiring, and filling a conductive material in said insulating layer hole portions by electrolytic plating using said conductive substrate as a power feeding layer, thereby to form external connection terminals; and
    exposing said first layer circuit wiring by removing said conductive substrate or removing said conductive substrate such that part of said conductive substrate remains.

2. A manufacture method of a flexible multilayer wiring board according to claim 1, wherein by repeating said laminating, second forming and third forming n times wherein n is an integer equal to or greater than two, formation of the first to (n+1)th layer circuit wirings and interlayer connection therebetween are performed, and said removing is applied to said (n+1)th layer circuit wiring.

3. A manufacture method of a flexible multilayer wiring board according to claim 1, wherein said first layer circuit wiring includes a four-layer structure composed of a nickel layer, a gold layer, a nickel layer and a copper layer stacked in an order named from the side of said conductive substrate, and said conductive substrate is a copper substrate.

4. A manufacture method of a flexible multilayer wiring board according to claim 3, wherein said conductive substrate is removed by etching in said exposing.

5. A manufacture method of a flexible multilayer wiring board according to claim 1, wherein said first layer circuit wiring includes a three-layer structure composed of a gold layer, a nickel layer and a copper layer stacked in an order named from the side of said conductive substrate, and said conductive substrate is a stainless steel substrate.

6. A manufacture method of a flexible multilayer wiring board according to claim 5, wherein said conductive substrate is removed by etching in said exposing.

7. A manufacture method of a flexible multilayer wiring board according to claim 1, wherein said first layer circuit wiring has a single-layer structure made of gold or copper, and said conductive substrate is a stainless steel substrate.

8. A manufacture method of a flexible multilayer wiring board according to claim 7, wherein said conductive substrate is removed by physical exfoliation in said exposing.

9. A manufacture method of a flexible multilayer wiring board according to claim 1, wherein, in said laminating, metal foil provided with an insulating resin layer on one side thereof is laminated onto said conductive substrate such that said insulating resin layer covers said first layer circuit wiring.

10. A manufacture method of a flexible multilayer wiring board according to claim 1, wherein copper foil is used as said metal foil in said laminating.

11. A manufacture method of a flexible multilayer wiring board according to claim 1, wherein a YAG laser is used for producing said laser beam in said second forming.

* * * * *